United States Patent
Chen

(10) Patent No.: US 6,573,166 B2
(45) Date of Patent: Jun. 3, 2003

(54) METHOD OF FABRICATING A LDD WITH DIFFERENT RESISTANCE VALUE

(75) Inventor: Chin-Yang Chen, Chi-Lung (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/681,990

(22) Filed: Jul. 3, 2001

(65) Prior Publication Data

US 2003/0008465 A1 Jan. 9, 2003

(51) Int. Cl.[7] ............................................. H01L 21/265
(52) U.S. Cl. ................... 438/519; 438/232; 438/306; 438/514; 438/527; 438/529
(58) Field of Search ......................... 438/519, 306, 438/305, 286, 401, 275, 231, 232, 203, 279, 301, 367, 199, 149, 152, 166, 238, 295, 213, 514, 527, 529

(56) References Cited

U.S. PATENT DOCUMENTS 5,834,352 A * 11/1998 Choi ........................ 438/275
5,955,746 A * 9/1999 Kim ........................... 257/69
6,077,736 A * 6/2000 Hwang et al. ............ 438/231

* cited by examiner

Primary Examiner—Matthew Smith
Assistant Examiner—Igwe U. Anya
(74) Attorney, Agent, or Firm—Winston Hsu

(57) ABSTRACT

A method of fabricating lightly doped drains (LDD) of different resistance values starts by providing a semiconductor wafer, the semiconductor wafer having a first active area and a second active area positioned on the substrate. Secondly, a first gate and a second gate are formed on the first active area and the second active area, respectively. A first ion implantation process is then performed to implant dopants of a first electric type on a surface of portions of the substrate within the second active area, followed by performing a second ion implantation process to implant dopants of a second electric type on a surface of portions of the substrate within the first active area and second active area. Finally, the dopants of each electric type are activated to form a first LDD and a second LDD adjacent to the first gate and the second gate, respectively, the first LDD and the second LDD being of different resistance values.

5 Claims, 7 Drawing Sheets

METHOD OF FABRICATING A LDD WITH DIFFERENT RESISTANCE VALUE

BACKGROUND OF INVENTION

1. Field of the Invention

The present invention relates to a method of fabricating lightly doped drains (LDDs) of different resistance values, and more particularly, to a method that is applied to SRAM for increasing a cell ratio of the SRAM.

2. Description of the Prior Art

In a semiconductor wafer, memory cells are divided into dynamic random access memory (DRAM) and static random access memory (SRAM) by a way of data storage. DRAM uses an electrically charged state of a capacitor in the memory cell to determine stored logical data, and SRAM uses conductive states of transistors in the memory cell to determine stored logical data. Compared to DRAM, SRAM has advantages of high speed, low power consumption, simple operation, easy design and not needing regular refresh. However, because six transistors are required for each SRAM memory cell, SRAM integration is hard to improve.

Please refer to FIG. 1, which is a circuit diagram of an SRAM cell 10 in full CMOS. The traditional SRAM cell 10 has two PMOS-type load transistors 12, 14 functioning as a load element, two NMOS-type driver transistors 16, 18 functioning as a driver, and two NMOS-type access transistors 20, 22 for data access in the SRAM.

As shown in FIG. 1, sources of the load transistors 12, 14 are connected to VDD, and drains of the load transistors 12, 14 are connected in series to drains of the driver transistors 16, 18 at nodes 24, 26, respectively. Sources of the driver transistors 16, 18 are electrically connected to VSS. In addition, gates of the load transistors 12, 14 are connected to gates of the driver transistors 16, 18. These connection lines are cross-coupled with nodes 26, 24, respectively. Both gates of the access transistors 20, 22 are connected to a word line 27. Sources of the access transistors 20, 22 are connected to a bit line 28 and a bit line 29, respectively, and drains of the access transistors 20, 22 are connected to drains of the driver transistors 16, 18 at nodes 24, 26, respectively.

Taking logic "1" storage as an example, when storing data, the access transistors 20, 22 are turned on by adjusting a voltage of the word line 27, in order to store data at nodes 24, 26. A higher voltage state (3V) is inputted to the bit line 28 and a lower voltage state (0V) is inputted to the bit line 29. Therefore, the load transistor 12 and the driver transistor 18 are turned on, and the load transistor 14 and the driver transistor 16 are turned off. Therefore, a portion of the current flow in node 26 runs to VSS via the turned on driver transistor 18, but the current flow in the node 24 cannot run to the VSS via the turned off driver transistor 16. Consequently, node 24 is in a "higher" voltage state and node 26 is in a "lower" voltage state. Finally, the word line 27 is turned off, so that nodes 24, 26 are locked to maintain the same state, and the data are stored at the nodes 24, 26, respectively.

However, the data storage may be damaged by noise and an unbalanced threshold, and the data storage ability is related to cell ratio. Cell ratio is a driver transistor to access transistor current driving capability ratio. As shown in FIG. 1, in a case where the data is stored with a "lower" state at node 24 and a "higher" state at node 26, the voltage of node 24 is determined by the current flow magnitude of the driver transistor 16, 18 to the access transistors 20, 22. If the current flow passing the driver transistors 16, 18 is increased and current flow passing the access transistors 20, 22 is decreased, that is increasing cell ratio, the node 24 is intended to maintain the "lower" state. Even during a process of reading the cell memory data, the voltage of the node 24 is not drastically changed from the "lower" state when the voltages of bit lines 28, 29 are changed to turn on the access transistors 20, 22. Because the voltage of node 24 is not changed heavily, the cross-coupled node 26 is still maintained in the "higher" state and the data storage state is not changed.

Therefore, in order to improve performance and stability, the cell ratio of SRAM must be larger than 1. Traditional approaches to increase cell ratio are:

1. Increasing channel width or channel length.

The approach is increasing channel width of the driver transistor or increasing channel length of the access transistor to adjust the current flowing through the driver transistor and access transistor. Although the approach can directly increase cell ratio, increasing the channel width and channel length leads to SRAM size increase, thereby seriously affecting the integration of the SRAM process.

2. Using different threshold voltages or thicknesses of gate oxides.

The approach uses two different masks to form different thicknesses of gate oxides during a fabrication process of the driver transistor and the access transistor, thereby leading to different gate threshold voltages of these two transistors, so as to affect the ratio of currents. However, the approach needs additional mask processes and incurs a higher fabrication cost.

SUMMARY OF INVENTION

It is therefore a primary objective of the present invention to provide a fabrication method for increasing SRAM cell ratio, and solving the above-mentioned problems.

It is a secondary objective of the present invention to provide a method of forming LDDs having different resistance values, so as to increase a cell ratio in the SRAM.

In accordance with the claim invention, the method first involves providing a semiconductor wafer, the semiconductor wafer comprising a first active area and a second active area set on the substrate. Secondly, a first gate and a second gate are formed on the first active area and the second active area, respectively. A first ion implantation process is then performed to implant dopants of a first electric type on a surface of portions of the substrate within the second active area, followed by performing a second ion implantation process to implant dopants of a second electric type on a surface of portions of the substrate within the first and the second active area. Finally, the dopants of each electric type are activated to form a first LDD and a second LDD adjacent to the first gate and the second gate, respectively, the first LDD and the second LDD being of different resistance values.

Because the present invention uses two ion implantation processes to let the driver transistors and the access transistors have different dopant concentrations, different resistance values are acquired to increase cell ratio. Moreover, the ion implantation processes according to the present invention can be performed with other PMOS transistors at the same time, so that no additional mask process is needed, which lowers the process cost. Therefore, the present invention avoids drawbacks of incurring additional process costs and increases of SRAM integration according to the prior art.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
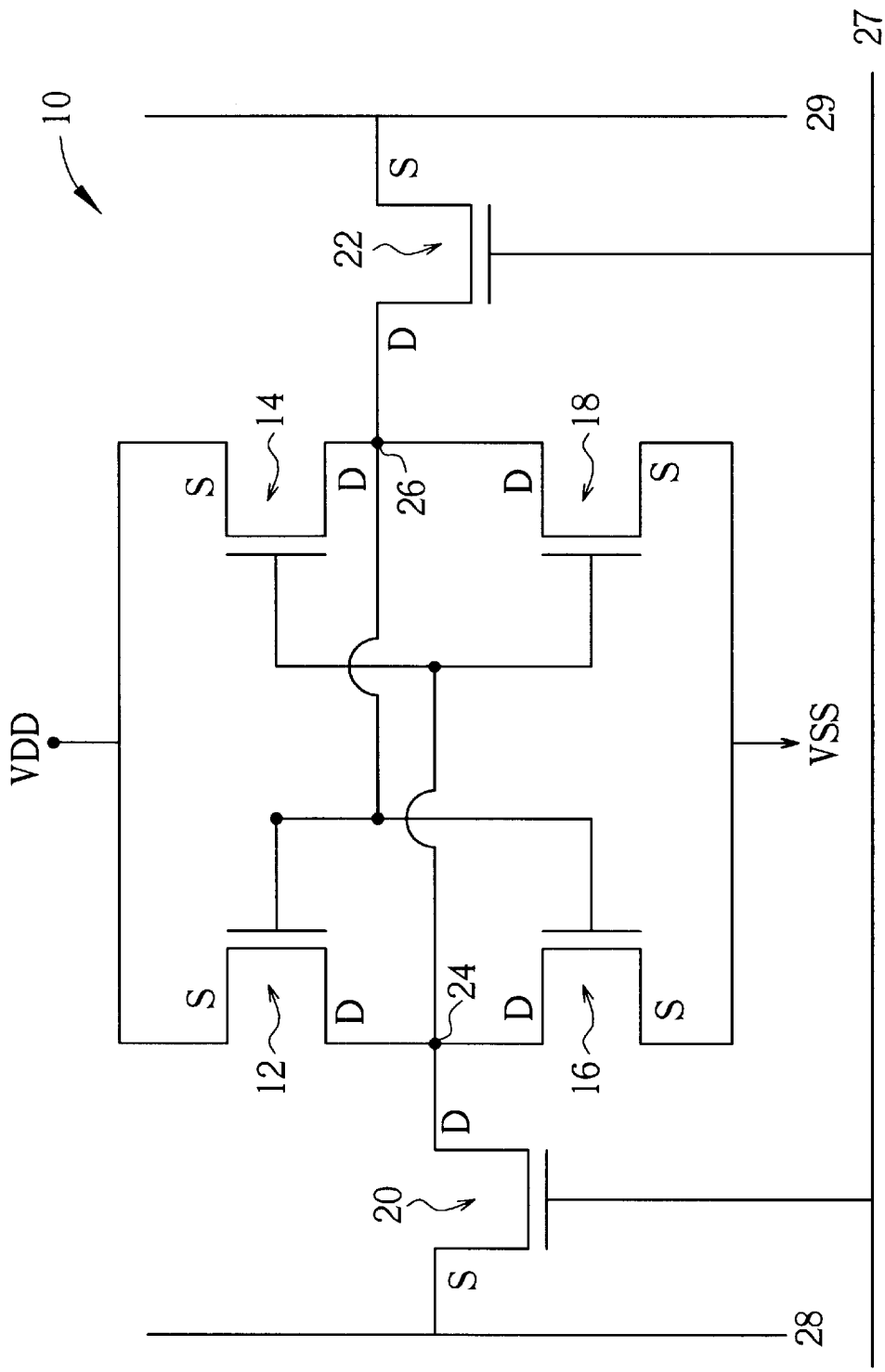
FIG. 1 is a circuit diagram of an SRAM cell in full CMOS.
Figure 2:
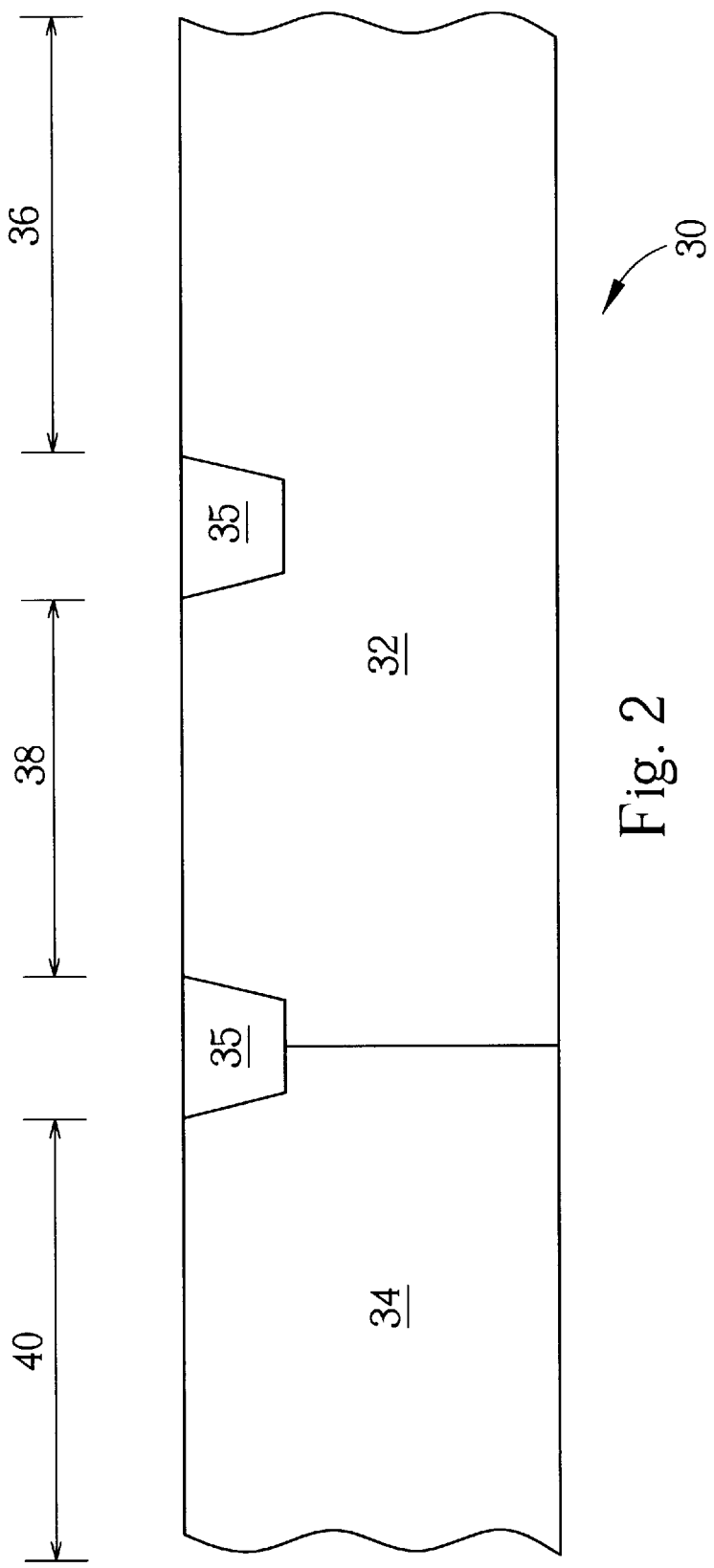
FIG. 2 to FIG. 7 are schematic diagrams of an SRAM fabrication method according to the present invention.

Please refer to FIG. 2 to FIG. 7. FIG. 2 to FIG. 7 are schematic diagrams of an SRAM fabrication method according to the present invention. As shown in FIG. 2, the present invention first involves providing a semiconductor wafer 30. The semiconductor wafer 30 comprises a P-type substrate 32 and an N-type substrate 34. A first active area 36 and a second active area 38 are positioned on the P-type substrate 32, and a third active area 40 is positioned on the N-type substrate 34. A plurality of shallow trenches 35, or field oxides, is used to isolate each area. Wherein, the first active area 36 and the second active area 38 are predetermined positions of driver transistors and access transistors, respectively. The third active area 40 is a predetermined position of input/output (I/O) transistors or other PMOS transistors. The P-type substrate 32 and N-type substrate 34 can be a P-well and an N-well, respectively.

Figure 3:
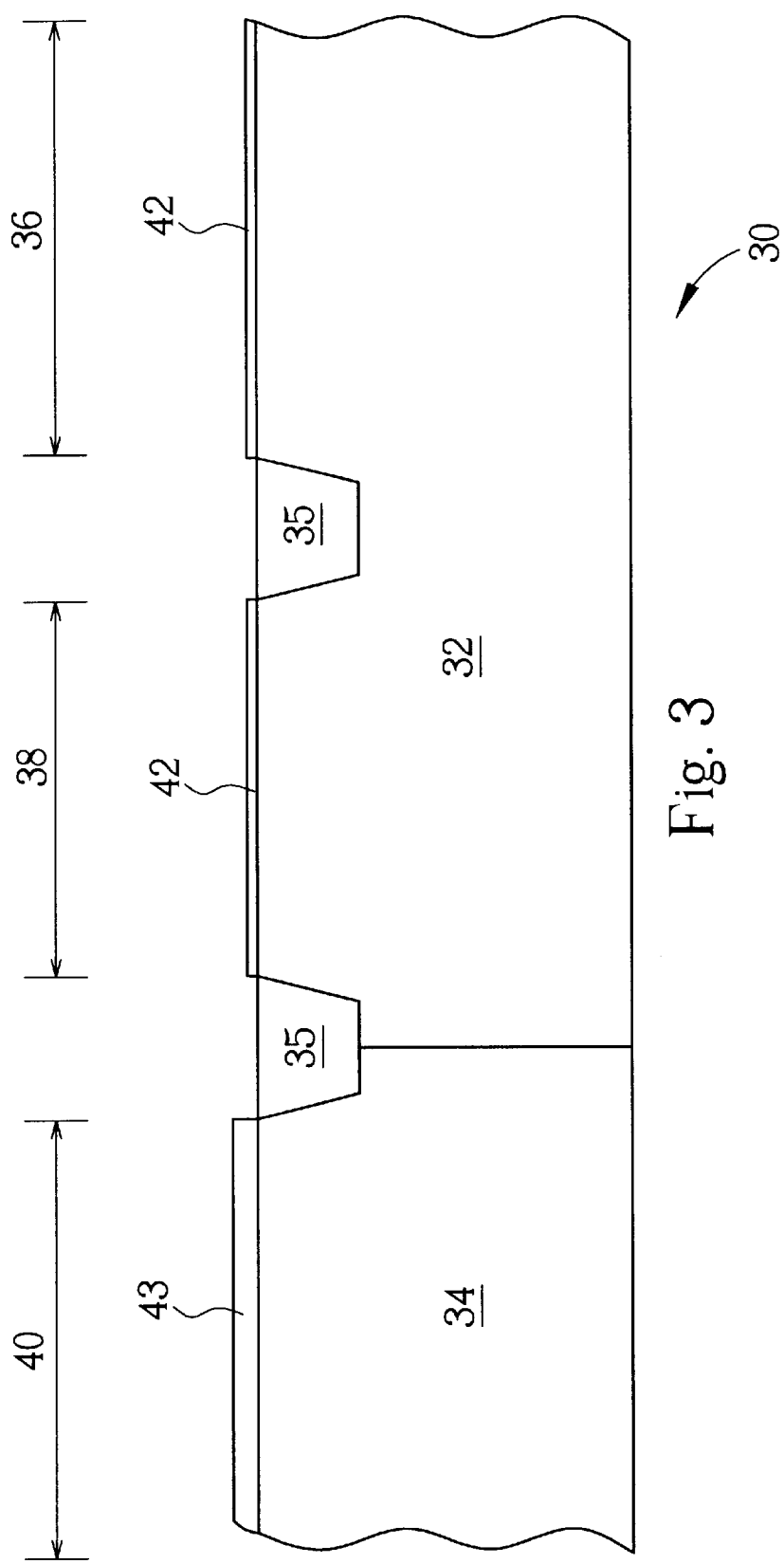

As shown in FIG. 3, a photoresist coating and dry oxidation process are used to oxidize the surfaces of the first active area 26, the second active area 38 and the third active area 40, forming silicon oxide layers of different thicknesses, which function as gate oxides 42 on the first active area 36 and the second active area 38, and a gate oxide 43 on the third active area 40. Wherein, a thickness of the gate oxide 43 on the third active area 40 is greater than a thickness of the gate oxides 42 on the first active area 36 and the second active area 38.

Figure 4:
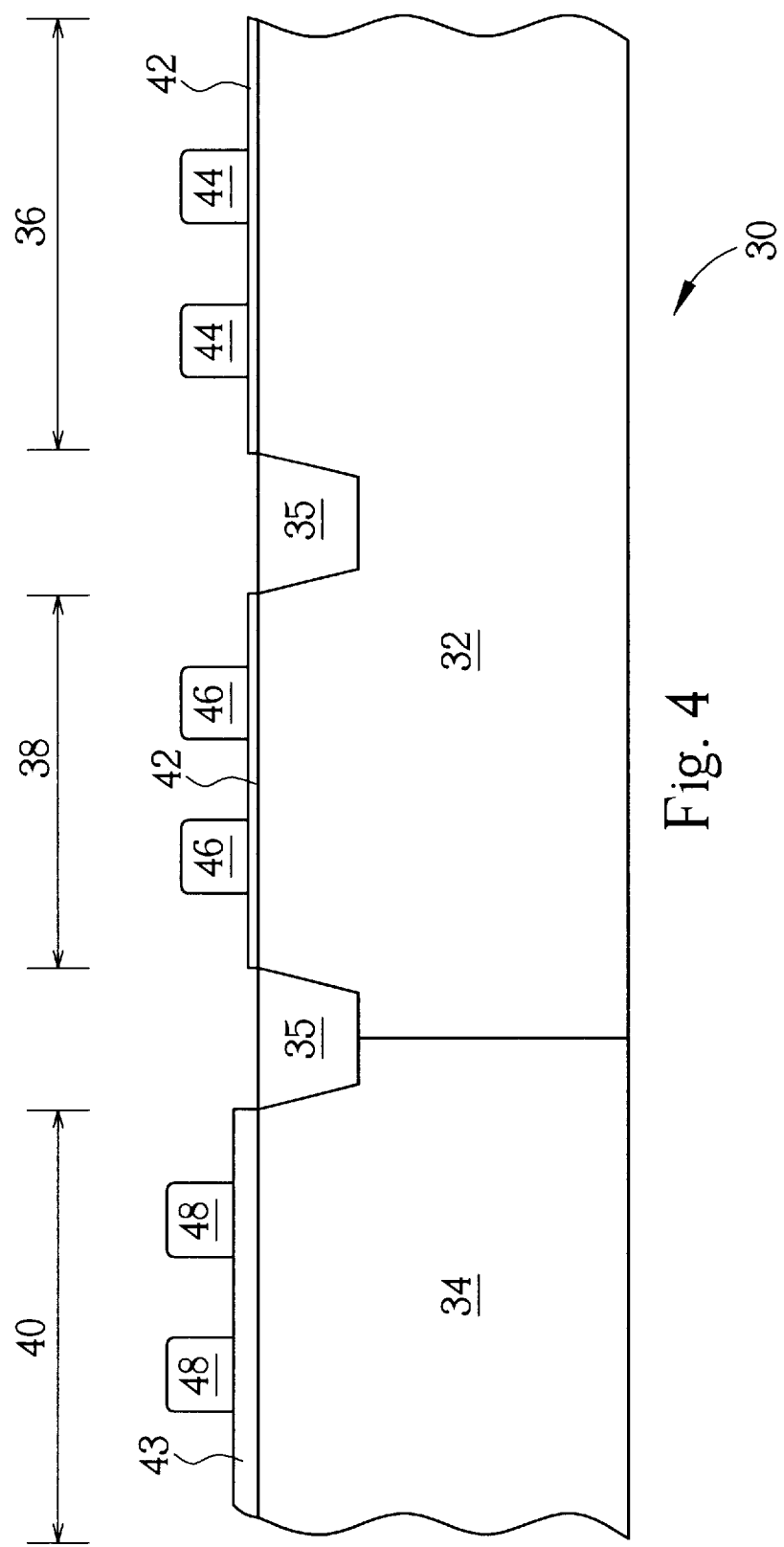

As shown in FIG. 4, a low-pressure chemical vapor deposition (LPCVD) process is performed to form a polysilicon layer (not shown) on the surface of the semiconductor wafer 30. A photolithography and etching process are then performed to define the positions of gates 44, 46, 48 on the surfaces of the first active area 36, the second active area 38 and the third active area 40. Gate fabrication is not limited to use of the polysilicon gate, but other kinds of gates, such as metal gates, or tungsten silicide layer and polysilicon layer stacked gates, are all applicable to the present invention.

Figure 5:
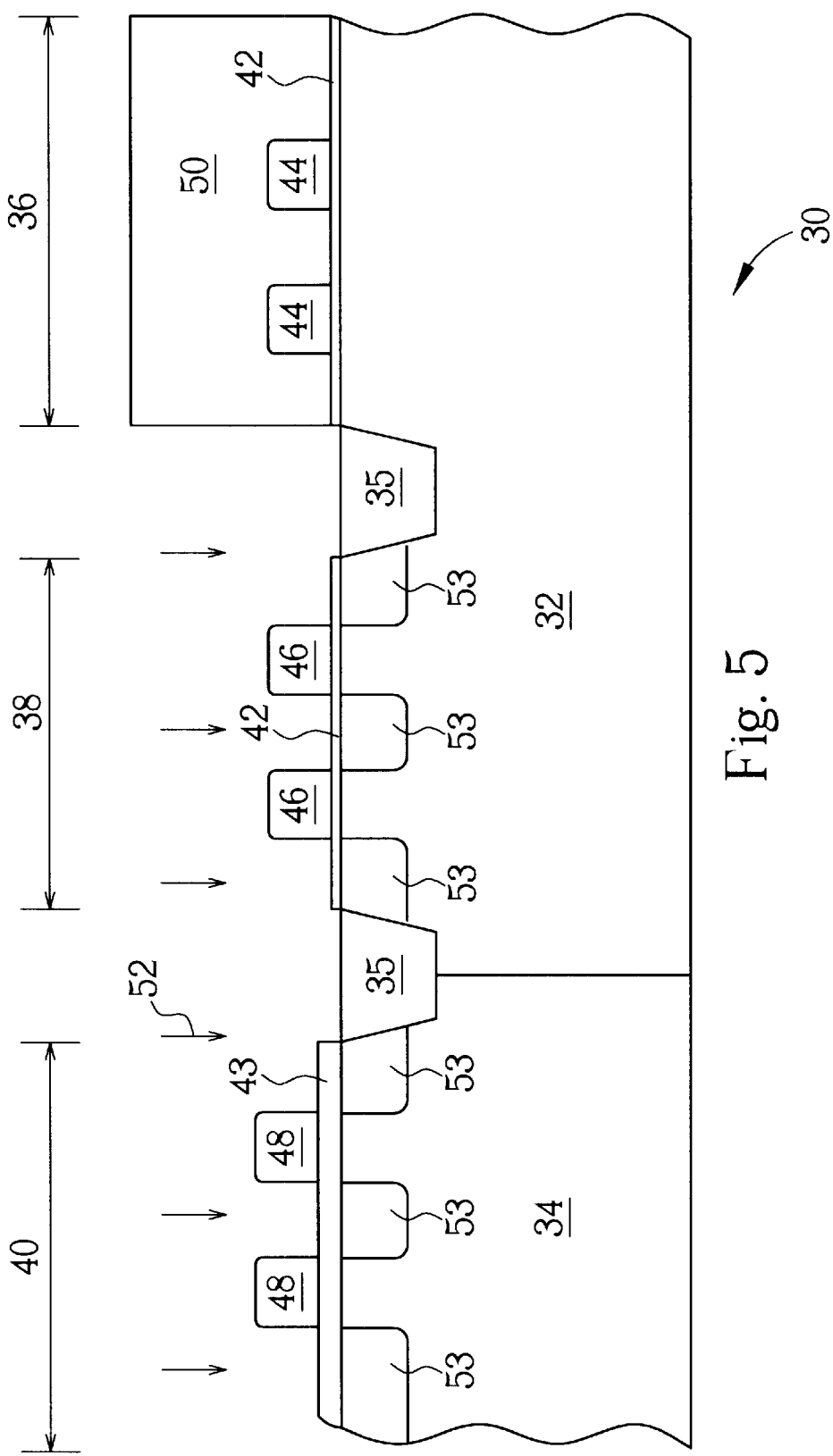
Figure 6:
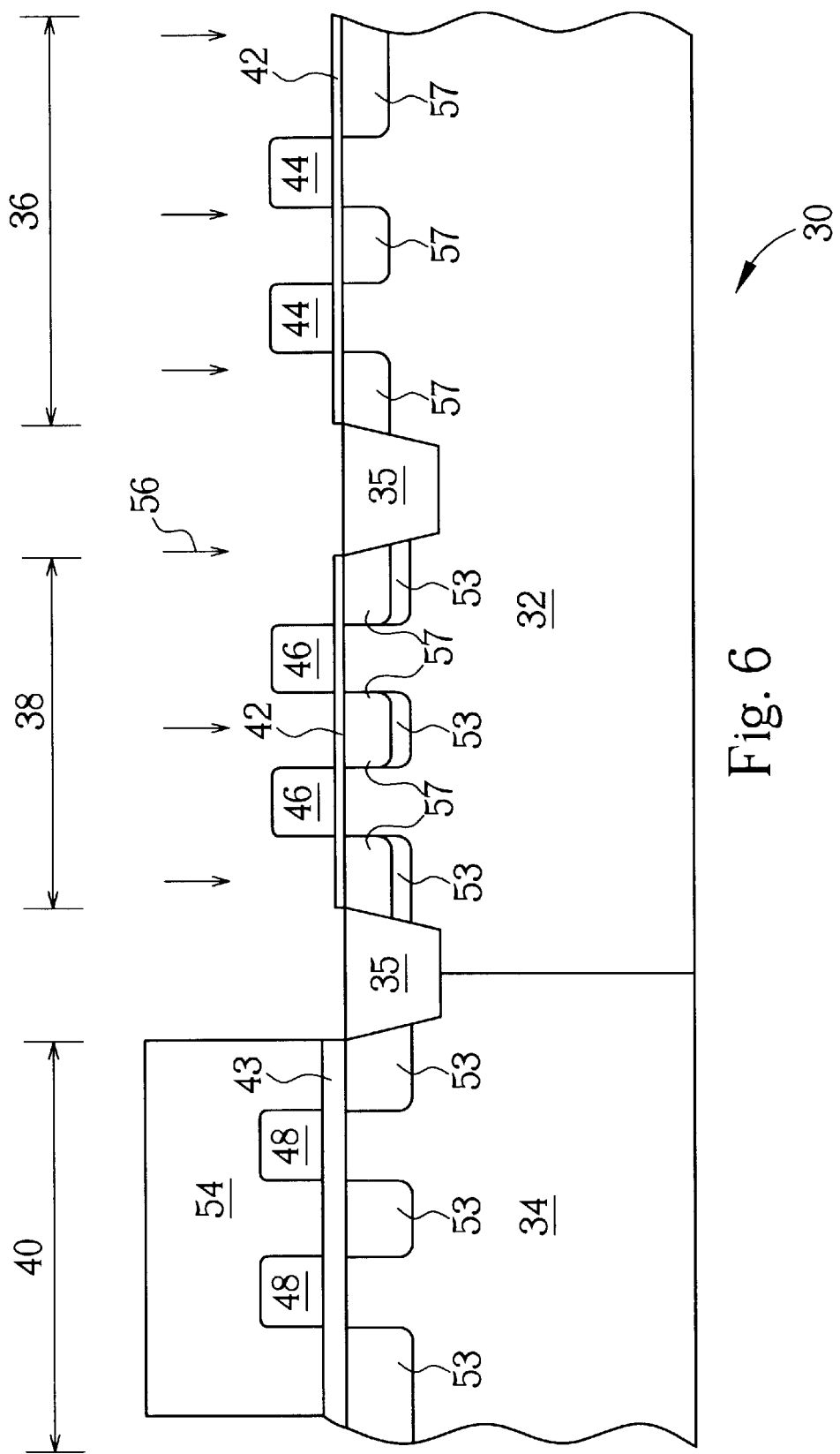

As shown in FIG. 5, a photoresist layer is formed to coat the surface of the semiconductor wafer 30, followed by using a photolithography process to have the photoresist layer 50 cover the first active area 36 and function as a mask. A first ion implantation process 52 is then performed to implant P-type dopants, such as boron ions, on the second active area 38 and the third active area 40. The implantation dosage is about $1*10^{18}$ dopants/$cm^3$. Therefore, P-type doped regions 53 are formed on the surface of the substrates 32, 34 adjacent to the gates 46, 48 on the second active area 38 and the third active area 40. After removing the photoresist layer 50, as shown in FIG. 6, a photoresist layer 54 is formed to cover the surface of the third active area 40 and function as a mask. A second ion implantation process 56 is then performed to implant N-type dopants such as phosphorus ions into the first active area 36 and the second active area 38. The implantation dosage is about $5*10^{18}$ dopants/$cm^3$. Therefore, N-type doped regions 57 are formed on the surface of the substrate 32 adjacent to the gates 44,46 on the first active area 36 and the second active area 38.

Figure 7:
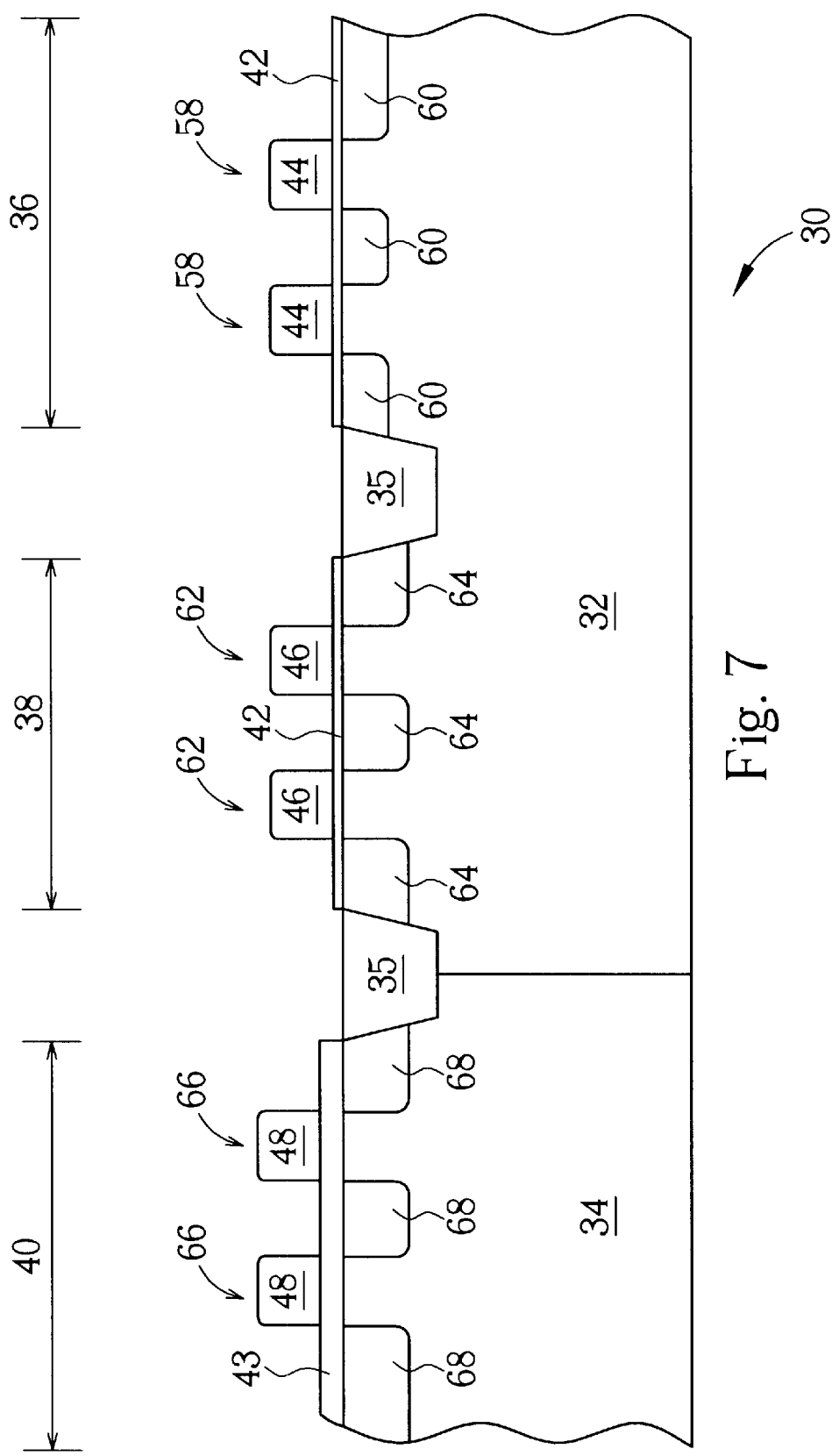

Finally, as shown in FIG. 7, after removing the photoresist layer 54, a temperature of 900–1000° C. is used to active the P-type and N-type dopants to have equal diffusion in the doped areas. Therefore, lightly doped drains (LDD) 60, 64, 68 are respectively formed adjacent gates 44, 46, 48 on the first active area 36, the second active area 38 and the third active area 40, respectively. Other subsequent processes are then performed to complete the fabrication of driver transistors 58, access transistors 62 and I/O transistors 66 on the first active area 36, the second active area 38 and the third active area 40. Wherein, the first ion implantation process 52 which is performed on the second active area 38 and the third active area 40 can occur after the second ion implantation process 56 which is performed on the first active area 36 and the second active area 38.

Because the surface of second active area 38 undergoes the first ion implantation process 52 and the second ion implantation process 56, the second active area 38 includes simultaneously N-type and P-type dopants. And since the concentration of N-type dopants is higher than the concentration of P-type dopants, the dosage of the P-type dopants is neutralized by a portion of the N-type dopants, so that the LDD 64 forms a low concentration N-type doped region on the second active area 38. Therefore, the concentration of LDD 64 on the second active area 38 is lower than the concentration of LDD 60 on the first active area 36. Because the low doped concentration leads to poor conductivity and a higher resistance value during channel opening, the resistance value of LDD 60 of the driver transistor 58 on the first active area 36 is less than the resistance value of LDD 64 of the driver transistor 62 on the second active area 38.

Consequently, when operating SRAM devices, the current passing through the access transistor 62 decreases due to the higher resistance of the LDD 64, and the current passing through the driver transistor 58 increases due to the lower resistance of the LDD 60. Consequently, the cell ratio is increased to stabilize the SRAM cell operation and improve the SRAM cell performance. In addition, because the ion implantation of P-type dopants on the access transistor 62 is simultaneously performed with other PMOS transistors or I/O transistors, no additional mask and process costs are required, and the SRAM cell ratio is improved.

In contrast to the prior art method of improving SRAM cell ratio, the present invention uses two ion implantation processes to have higher doped concentration on the driver transistors than the access transistors, leading to a lower resistance value of the driver transistors than the access transistors and a higher cell ratio. Moreover, the ion implantation of the present invention is simultaneously performed with other PMOS transistors, so that no additional mask is required. Consequently, the present invention avoids the drawbacks of additional process costs being needed and SRAM integration decreasing, as relates to the prior art. The present invention is not limited to application in SRAM cells, but other fabrication methods of LDDs with two different resistance values are also applicable to the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating lightly doped drains (LDD) having different resistance values, the method comprising:

providing a semiconductor wafer, a substrate of the semiconductor wafer comprising a first active area and a second active area set on the substrate;

forming a first gate and a second gate on the first active area and the second active area, respectively;

performing a first ion implantation process to implant dopants of a first electric type on a surface of portions of the substrate within the second active area;

performing a second ion implantation process to implant dopants of a second electric type on surfaces of portions of the substrate within the first active area and the second active area, the first electric type and the second electric type are different; and activating the dopants of each electric type and neutralizing portions of the dopants of each electric type to form, respectively, a first LDD and a second LDD ad and the to the first gate and the second gate, the first LDD and the second LDD having different resistance values.

2. The method of claim 1 wherein the first electric type is N-type, and the second electric type is P-type.

3. The method of claim 1 wherein the first electric type is P-type, and the second electric type is N-type.

4. The method of claim 1 wherein the substrate of the semiconductor wafer further comprises a third active area, and a third gate is positioned on a surface of portions of the substrate within the third active area, a thickness of a gate oxide of the third gate being greater than a thickness of gate oxide layers of the first gate and the second gate.

5. The method of claim 4 wherein the first ion implantation process is performed to implant, simultaneously, dopants of the first electric type on the surface of portions of the substrate within the third active area to form a third LDD adjacent to the third gate.

* * * * *